United States Patent
Fiukowski et al.

(10) Patent No.: US 8,367,226 B2
(45) Date of Patent: Feb. 5, 2013

(54) ANNEALABLE LAYER SYSTEM

(75) Inventors: Joerg Fiukowski, Torgau (DE); Matthias List, Dresden (DE); Hans-Christian Hecht, Weinboehla (DE); Falk Milde, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 0 days.

(21) Appl. No.: 12/842,497

(22) Filed: Jul. 23, 2010

(65) Prior Publication Data

US 2010/0291393 A1 Nov. 18, 2010

Related U.S. Application Data

(62) Division of application No. 11/575,985, filed as application No. PCT/DE2005/001660 on Sep. 21, 2005.

(30) Foreign Application Priority Data

Sep. 27, 2004 (DE) .................... 10 2004 047 135

(51) Int. Cl.
*B32B 15/04* (2006.01)
(52) U.S. Cl. ......... 428/701; 428/432; 428/433; 428/702
(58) Field of Classification Search ............. 428/432, 428/433, 434, 701, 702
See application file for complete search history.

(56) References Cited

U.S. PATENT DOCUMENTS

| | | | |
|---|---|---|---|
| 4,322,276 A | 3/1982 | Meckel et al. | |
| 4,761,218 A | 8/1988 | Boys | |
| 5,085,926 A * | 2/1992 | Iida et al. | 428/216 |
| 5,810,982 A | 9/1998 | Sellers | |
| 5,827,409 A | 10/1998 | Iwata et al. | |
| 6,217,719 B1 | 4/2001 | Kanazawa et al. | |
| 6,723,211 B2 | 4/2004 | Lingle et al. | |
| 6,730,352 B2 * | 5/2004 | Stachowiak | 427/165 |
| 2001/0007715 A1 | 7/2001 | Toyoshima | |
| 2002/0064662 A1 | 5/2002 | Lingle et al. | |
| 2003/0044652 A1 * | 3/2003 | Wang | 428/699 |
| 2003/0150711 A1 | 8/2003 | Laird | |
| 2003/0170466 A1 * | 9/2003 | Stachowiak | 428/432 |
| 2003/0175527 A1 * | 9/2003 | Lingle | 428/426 |
| 2003/0194489 A1 * | 10/2003 | Stachowiak | 427/162 |
| 2003/0198816 A1 * | 10/2003 | Lingle et al. | 428/432 |
| 2004/0005467 A1 * | 1/2004 | Neuman et al. | 428/432 |
| 2004/0121165 A1 | 6/2004 | Laird | |
| 2005/0186482 A1 * | 8/2005 | Maschwitz | 430/1 |
| 2007/0273991 A1 * | 11/2007 | List et al. | 359/887 |

FOREIGN PATENT DOCUMENTS

| EP | 1174397 | 1/2002 |
|---|---|---|
| EP | 1 238 950 | 9/2002 |

* cited by examiner

*Primary Examiner* — Jennifer McNeil
*Assistant Examiner* — Lauren Colgan
(74) *Attorney, Agent, or Firm* — Heslin Rothenberg Farley & Mesiti P.C.

(57) ABSTRACT

A layer system that can be annealed comprises a transparent substrate, preferably a glass substrate, and a first layer sequence which is applied directly to the substrate or to one or more bottom layers that are deposited onto the substrate. The layer sequence includes a substrate-proximal blocking layer, a selective layer and a substrate-distal blocking layer. Also provided is a method for producing a layer system that can be annealed and has a sufficient quality even under critical climatic conditions and/or undefined conditions of the substrate. During the heat treatment (annealing, bending), the color location of the layer system is maintained substantially stable and the color location can be widely varied at a low emissivity of the layer system. For this purpose, a first dielectric intermediate layer is interposed between the substrate-proximal blocking layer and the selective layer and is configured as a substoichiometric gradient layer.

6 Claims, 6 Drawing Sheets

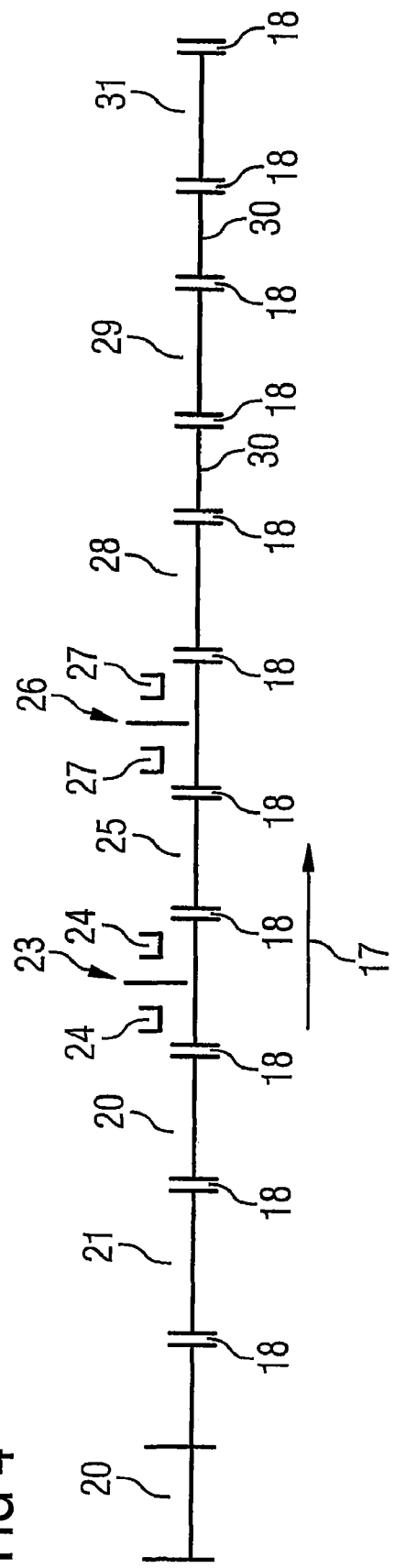

ANNEALABLE LAYER SYSTEM

CROSS REFERENCE TO RELATED APPLICATIONS

Figure 1:
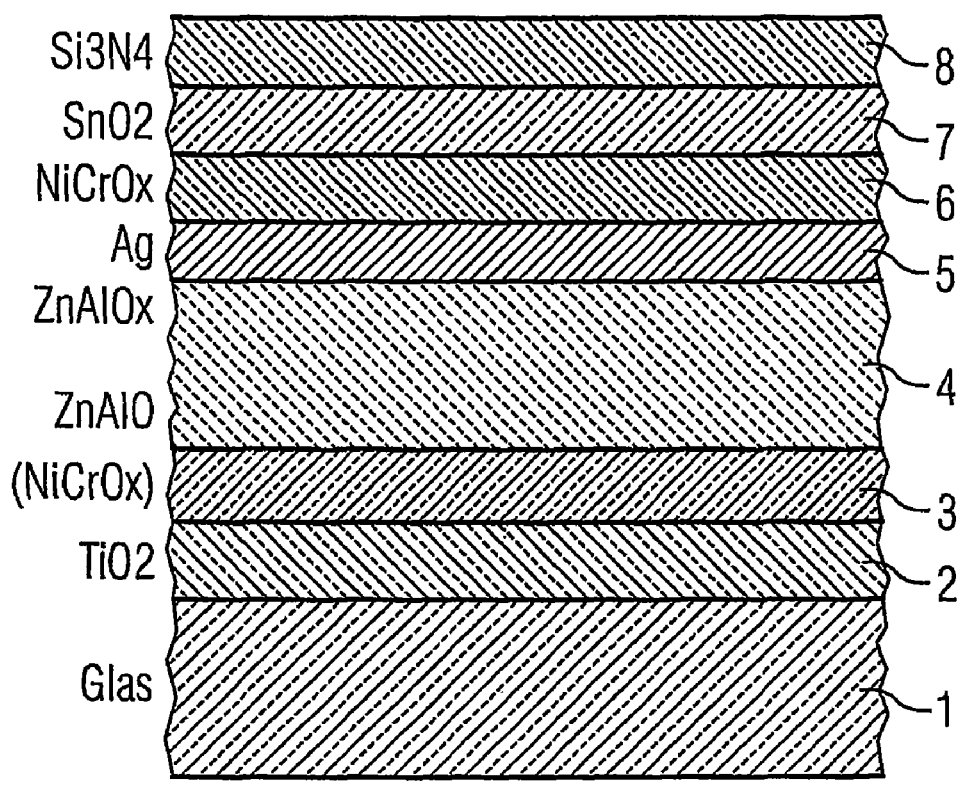

This application is a division of application Ser. No. 11/575,985 filed on Sep. 18, 2007 which is a Section 371 filing of international application PCT/DE2005/001660, filed on Sep. 21, 2005 and published, in German, as international publication WO 2006/034676 on Apr. 6, 2006, and claims priority of German Application No. 10 2004 047 135.5 filed on Sep. 27, 2004, all of which applications are hereby incorporated by reference herein, in their entirety.

BACKGROUND ART

The invention relates to an annealable layer system with a transparent substrate, preferably a glass substrate, and a first layer sequence which is applied to the substrate directly or is applied to one of more bottom layers which are deposited on the substrate. The layer sequence comprises a substrate-proximal blocking layer, a selective layer, and a substrate-distal blocking layer.

The invention also relates to a method for producing an annealable layer system, where in said method a first layer sequence is applied to a transparent substrate, preferably a glass substrate, either directly to the substrate or to one of more bottom layers which are deposited on the substrate. The layer sequence therein comprises a substrate-proximal blocking layer, a selective layer, and a substrate-distal blocking layer.

The customary blocking layers, which comprise silver layers(s) (for example, an NiCr or NiCrOx layer, cf. patents DE 035 43 178 and EP 1 174 379) or offer protection at least on one side, lead to a reduction of the conductivity of the silver layers(s). If a silver layer with a conductivity of ca. 5 ohm/sq. is deposited and this is embedded in two NiCrOx layers, then this embedding can lead to an increase of the conductivity by ca. 1.5 ohm/sq. to 6.5 ohm/sq.

In EP 0 999 192 B1 a layer system is described which comprises a silver layer as a selective layer which is provided on both sides with a blocking layer of nickel or nickel chromium. These blocking layers protect the sensitive silver layer against being affected by neighboring layers. Along with this, the layer system is stabilized during the heat treatment by inserting an NiCrOx layer into the functional silver layer with a single low-E [coating]. The disadvantage consists in the fact that in this layer system each individual silver partial layer must be ca. 7 to 8 nm thick in order to avoid the formation of islands of the silver partial layers. This leads to a low transmission for the layer system. Furthermore, in EP 0 999 192 B1 the use of a substoichiometric TiOx layer between the blocking layer and the silver layer is described, which is intended to reduce the formation of haze. This absorbing TiOx layer oxidizes during the heat treatment, wherein significant changes of transmission and a shift of the preset color location take place.

In this realization several layer sequences of sensitive silver layers with bottom layers and each with two blocking layers enclosing the respective silver layer are also provided.

In practice, annealable layer systems are frequently required, i. e. layers which after application are subjected once again to a heat treatment, for example, in order to harden or bend them. The layer represented in EP 099 192 B1 [sic] does not exhibit such ability to be annealed since the blocking layers, as they are represented therein, are not sufficiently resistant to diffusion processes so that, during the annealing, materials from neighboring layers can diffuse into the silver layers, which leads to undesirable changes in color [so that] the color location of the layer system cannot be kept stable.

In EP 1 238 950 A2 an annealable layer system is described which provides on both sides of a silver layer, as a sensitive layer, NiCrOx layers as blocking layers. Furthermore, in this layer system, dielectric intermediate layers are provided which are located both above and below the blocking layers. Layers of this type also act as diffusion barrier during the annealing processes.

Furthermore, in EP 1 238 950 the use of gradient layers in the stabilization of heat-treated layer systems is described. The disadvantage therein consists in the fact that the SiNx layer lies below the blocking layer, whereby the resistance, and thus the emissivity of the layer system, is not reduced.

It has been shown that layer constructs of this type are sensitive to climatic conditions so that under demanding climatic conditions these layer systems cannot be produced with a sufficient quality or yield. Also in the case of rough glass with undefined initial properties, this layer system exhibits quality problems in manufacture.

BRIEF SUMMARY OF THE INVENTION

It is thus the objective of the invention to specify a layer system and a method for its production which ensure sufficient quality in case of demanding climatic conditions and/or undefined states in the glass substrate. It is furthermore the objective of the invention to enable coating of a substrate with a layer system which can be heat-treated, where during the heat treatment (annealing, bending) the color location of the layer system can be kept essentially stable and in case of low emissivity of the layer system the color location can be varied widely.

In particular through a gradient structure of the dielectric intermediate layer the adhesive strength of the layer sequence can be improved significantly so that in case of demanding climatic conditions or in case of a substrate, preferably of rough glass with undefined starting conditions, which has led to adhesion problems in the layers, production methods can be controlled better. In this way the degradation of the silver layer during the heat treatment can also be prevented.

BRIEF DESCRIPTION OF THE DRAWING FIGURES

The invention will be explained in the following with the aid of three embodiment examples. In the corresponding drawings are shown FIG. 1 an annealable layer system with a silver (Ag) layer as selective layer and a dielectric intermediate layer, FIG. 2 an annealable layer system with two Ag layers and a dielectric intermediate layer for each, FIG. 3 an annealable layer system with two Ag layers and two dielectric intermediate layers for each, and FIG. 4 a schematic representation of a part of a coating system for realizing the layer system according to the invention.

As represented in FIG. 1, a glass substrate 1 is provided with a bottom layer 2 of TiO2. Deposited thereon is a first blocking layer 3 of NiCrOx. Since the bottom layer 2 already has properties of a blocking layer, the first blocking layer 3 can also be omitted in given cases, which is marked by the use of parentheses.

Figure 1A:
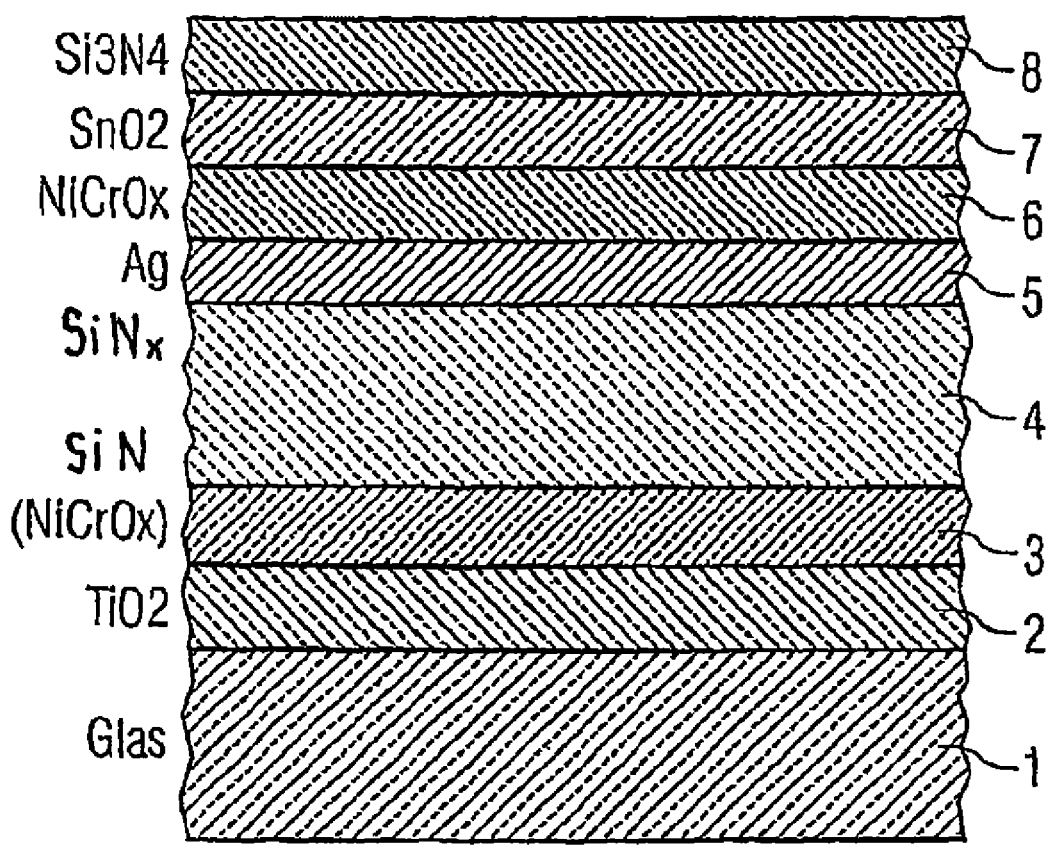
Figure 1:
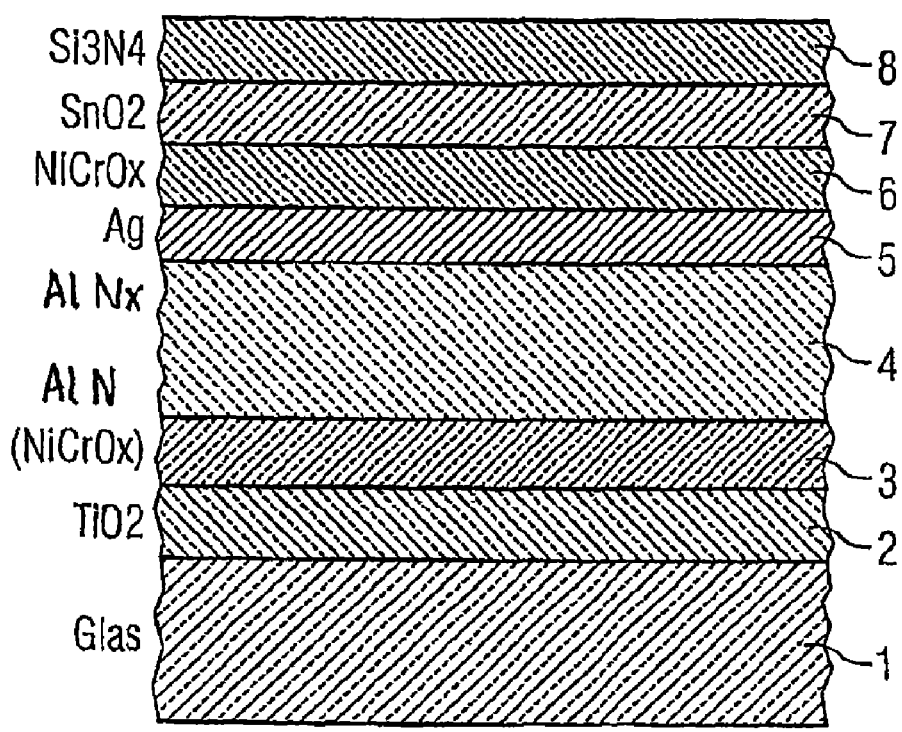

Following this is a first dielectric intermediate layer 4. This first dielectric intermediate layer 4 is deposited as a gradient layer, that is, it passes, over the thickness of one stoichiometric layer ZnAlO, as shown in FIG. 1, SiN as shown in FIG. 1a or AN as shown in FIG. 1b, into a substoichiometric layer, ZnAlOx as shown in FIG. 1, SiNx as shown in FIG. 1a or AlNx as shown in FIG. 1b. In so doing, the gradient from ZnAlO to ZnAlOx, SiN to SiNx, or AlN to AlNx is always directed in the direction of the following Ag layer as the first selective layer 5. This means that the substoichiometric part of the dielectric intermediate layer 4 is in the vicinity of the first selective layer 5.

The first selective layer 5 is subsequently provided with a second blocking layer 6. Following that is a first closing layer 7 of SnO2 and a second closing layer 8 of Si3N4.

The production of the gradient layer takes place in such a manner that within one coating compartment or within one recipient, through either of which the substrate is passed in one direction of movement, two magnetrons, each with the same target material ZnAl, are disposed in the direction of movement. First, the stoichiometric part of the first dielectric partial layer 4 is deposited via the first magnetron lying in the direction of transport. Thereafter, the substrate 1 runs through the area below the second magnetron in which the substoichiometric part of the first dielectric intermediate layer is deposited by the second magnetron being operated at high power, while the same reactive gas pressure prevails in the pump compartment, whereby a substoichiometric ratio develops in the part of the first dielectric intermediate layer 4. Since a greater sputter rate is also associated therewith, the second magnetron can be provided with a screen between the target and the substrate, said screen have a smaller opening than a screen between the target of the first magnetron and the substrate. Thus, the thickness ratios of the stoichiometric and substoichiometric partial layers can be set despite the different powers of the magnetrons, and thus the different sputter rates.

Another possibility for production consists in the first magnetron being disposed in a separate recipient or the compartment being divided into two separate partial compartments and for each magnetron a separate reactive gas environment being provided. Thus, for the substoichiometric part of the first dielectric intermediate layer 4, processing is possible with lower reactive feed.

Figure 2:
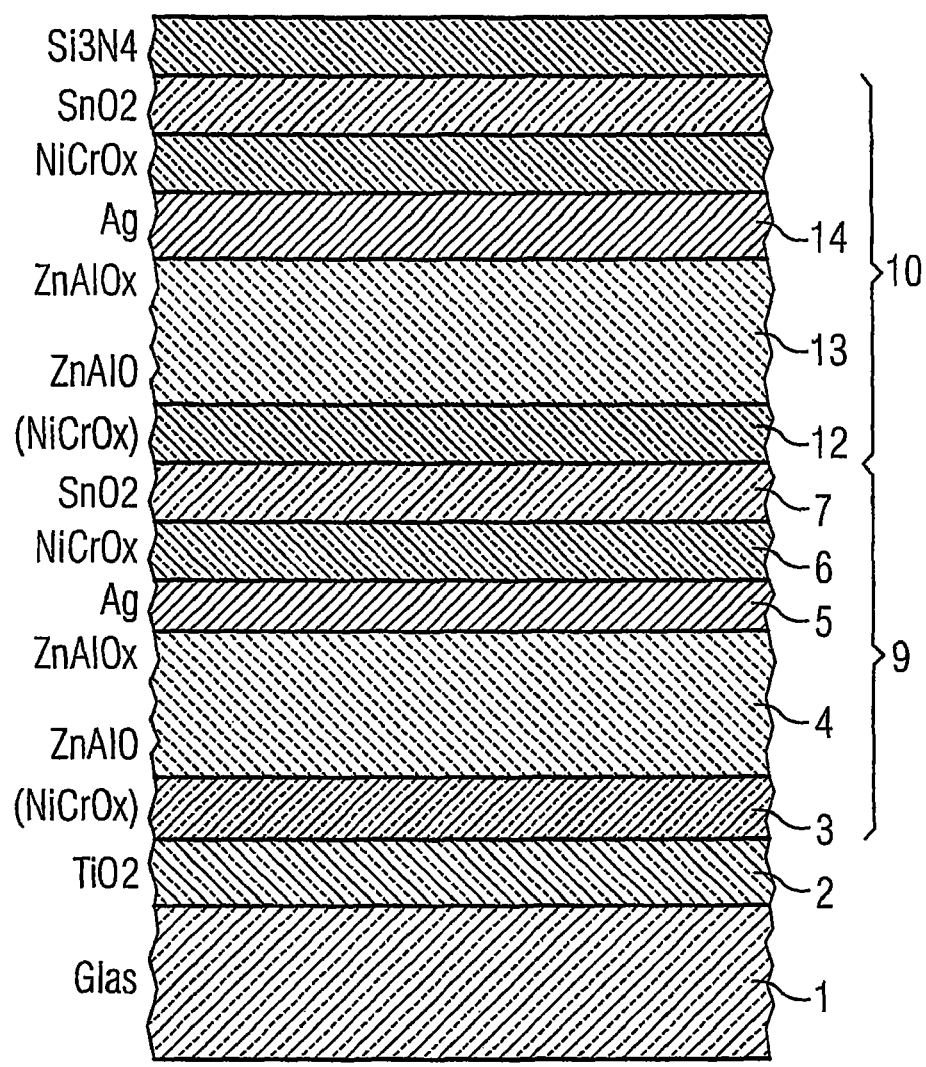

In FIG. 2 an annealable layer system is represented, in which, on the first layer sequence 9 (comprising a first blocking layer 3, a first dielectric intermediate layer 4, a first selective layer 5, a second blocking layer 6, and a first closing layer 7), a second layer sequence 10 is disposed with a second selective layer 14, a third blocking layer 12, and a third dielectric layer 11 [sic].

Figure 3:
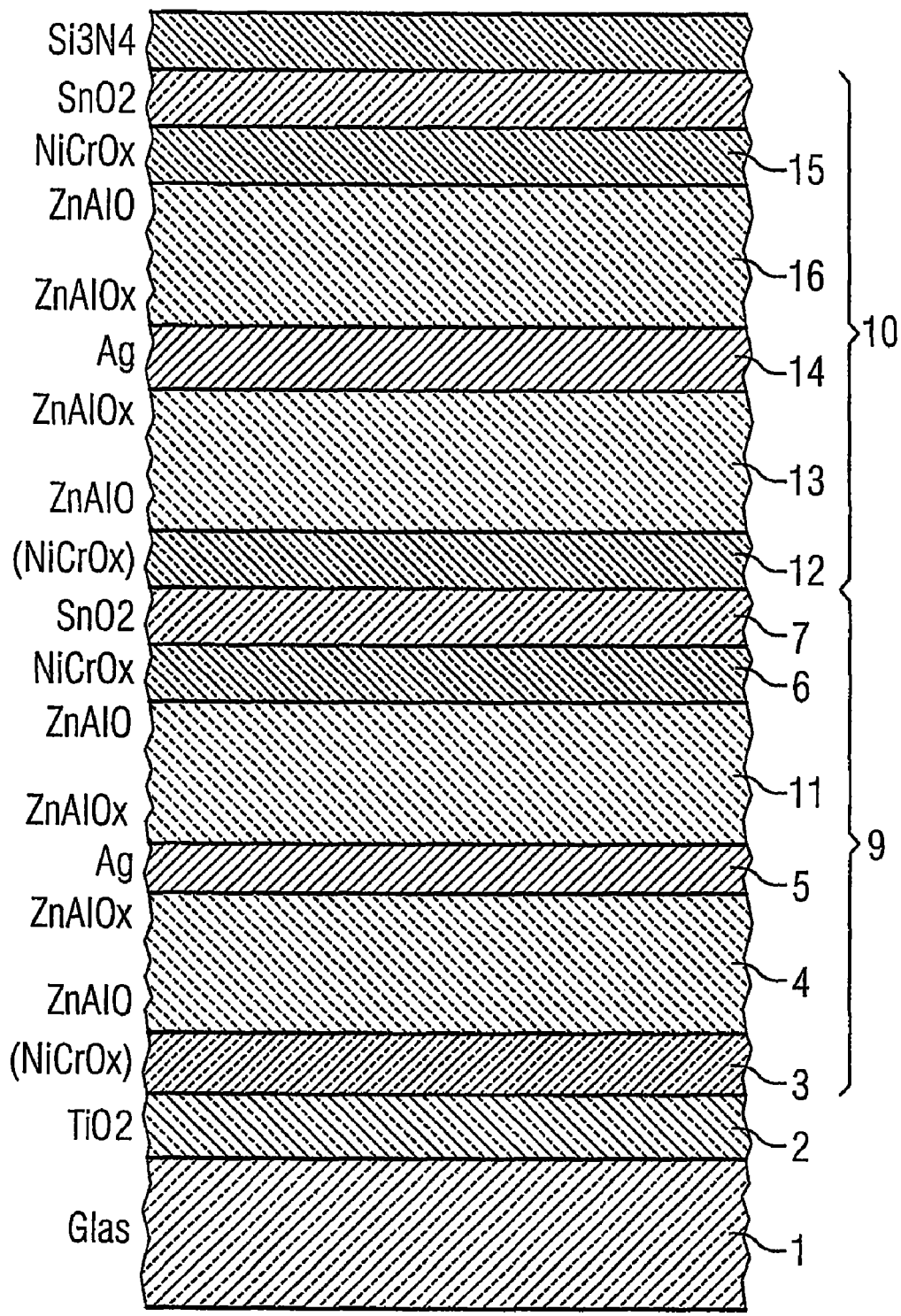

Described in FIG. 3 is an annealable layer system which is similar to the layer system in FIG. 2, but with the difference that between the first selective layer 5 and the second blocking layer a second dielectric intermediate layer 13 [sic] [is disposed] and between the second selective layer 14 and the fourth blocking layer 15 a fourth dielectric layer 16 [is disposed].

In FIG. 4 a part of a coating system is represented in schematic form, said coating system serving for building up a layer system according to the invention.

In this coating system the substrates 1 can be moved through the individual coating stations in a transport device 17, where a separation of the individual stations is realized by flow resistors 18 or gas locks 19 with flow resistors 18.

A two-stage ion beam station 20 is followed, after a flow resistor 18, by a TiOx coating station 21. Following this, after a flow resistor 18, is a first NiCrOx coating station 22 [sic]. Following an additional flow resistor 18 is a first coating compartment 23 with two magnetrons 24 which are operated at different powers, the left magnetron 24 at lower power than the right. Thus, a dielectric intermediate layer 4 or 11 is deposited, where the substoichiometric part of the first dielectric intermediate layer 4 or 11 abuts the Ag layer 5 or 14, which is deposited in an Ag coating station 25 following after a flow resistor 18. For generating an additional dielectric intermediate layer 13 or 16 a second coating compartment 26 follows, where there the left magnetron 27 runs at higher power than the right, otherwise, however, the second coating compartment 26 has a structure analogous to the first 23.

The second coating compartment 26 is followed, after a flow resistor 18, by a second NiCroX coating station 28. Up to this point, due to the layer structure, all the stations could be separated via flow resistors 18. Only a subsequent Sn coating station 29 is separated via two gas locks 30, which in turn are flanked on both sides by flow resistors 18.

This is followed by a Si:Al coating station 31.

The invention claimed is:

1. Annealable layer system comprising a transparent substrate, and a first layer sequence which is applied to the substrate directly or to one or more bottom layers which are deposited on the substrate, wherein the layer sequence comprises a substrate-proximal blocking layer comprising NiCrOx, a first selective layer, and a substrate-distal blocking layer comprising NiCrOx, and a first dielectric intermediate layer of ZnAlOx is disposed between the substrate-proximal blocking layer and the first selective layer, and the first dielectric intermediate layer comprises a gradient layer with a gradient that passes from a stoichiometric part of ZnAlO to a substoichiometric part of ZnAlOx, and where the gradient points in a direction of the first selective layer, such that the substoichiometric part of the gradient layer lies on a side of the first selective layer.

2. Annealable layer system according to 1, wherein the layer sequence comprises a $TiO_2$ bottom layer, the substrate-proximal blocking layer comprising NiCrOx, the gradient layer with a gradient that passes from a stoichiometric part of ZnAlO to a substoichiometric part of ZnAlOx, and where the gradient points in a direction of the first selective layer, such that the substoichiometric part of the gradient layer lies on a side of the first selective laver, the first selective layer comprising Ag, the substrate-distal blocking layer comprising NiCrOx , an $SnO_2$ layer, and an $Si_3N_4$ layer.

3. Annealable layer system according to claim 1, further comprising, between the first selective layer and the substrate-distal blocking layer, a second dielectric intermediate layer.

4. Annealable layer system according to claim 1, further comprising a second layer sequence disposed on the first layer sequence, directly or with additional layers lying therebetween, the second layer sequence comprising a second substrate-proximal blocking laver, a second selective laver, a second substrate-distal blocking laver, and a second dielectric intermediate layer of ZnAlOx disposed between the second substrate-proximal blocking layer and the second selective layer, and the second dielectric intermediate layer is at least partially sub stoichiometric.

5. Annealable layer system according to claim 1, wherein the transparent substrate comprises a glass substrate.

6. Annealable layer system according to claim 1, wherein the layer sequence comprises a substrate-proximal blocking layer, a gradient layer with a gradient that passes from a stoichiometric part of ZnAlO to a substoichiometric part of ZnAlOx, and where the gradient points in a direction of the first selective layer, such that the substoichiometric part of the gradient layer lies on a side of the first selective layer, the first selective layer of Ag, the substrate-distal blocking layer of NiCrOx, an $SnO_2$ layer, and an $Si_3N_4$ layer.

* * * * *

UNITED STATES PATENT AND TRADEMARK OFFICE
CERTIFICATE OF CORRECTION

PATENT NO. : 8,367,226 B2
APPLICATION NO. : 12/842497
DATED : February 5, 2013
INVENTOR(S) : Fiukowski et al.

Page 1 of 1

It is certified that error appears in the above-identified patent and that said Letters Patent is hereby corrected as shown below:

Column 4, Line 49: Claim 4, Delete "blocking laver, a second selective laver" and insert -- blocking layer, a second selective layer --

Column 4, Line 50: Claim 4, Delete "blocking laver" and insert -- blocking layer --

Signed and Sealed this
Second Day of April, 2013

Teresa Stanek Rea
*Acting Director of the United States Patent and Trademark Office*